United States Patent [19]

Kelly

[11] Patent Number: 5,579,277
[45] Date of Patent: Nov. 26, 1996

[54] SYSTEM AND METHOD FOR INTERLEAVING MEMORY BANKS

[75] Inventor: James D. Kelly, Aptos, Calif.

[73] Assignee: Apple Computer, Inc., Cupertino, Calif.

[21] Appl. No.: 432,908

[22] Filed: May 1, 1995

[51] Int. Cl.$^6$ .................................................. G11C 13/00
[52] U.S. Cl. ............................... 365/230.02; 365/189.02; 365/230.01
[58] Field of Search ................... 361/189.01, 189.02, 361/189.04, 189.05, 230.01, 230.02, 230.03, 230.06

[56] References Cited

U.S. PATENT DOCUMENTS

| | | | |
|---|---|---|---|
| 3,753,242 | 8/1973 | Townsend | 365/189.01 |
| 4,908,798 | 3/1990 | Urai | 365/189.02 |

*Primary Examiner*—Terrell W. Fears
*Attorney, Agent, or Firm*—Burns, Doane, Swecker & Mathis

[57] ABSTRACT

A device and method are provided for mapping address bus bits to memory address by using interleaved and non-interleaved modes so that every desired row and column configuration stored in a register file may be supported. Also, the device and method allow a combination of interleaved and non-interleaved memory bank pairs to be used by registering row and column address in a plurality of registers corresponding to interleaved and non-interleaved combinations. In particular, the memory bank pairs which are capable of being interleaved have the interleaved operation performed automatically while the memory bank pairs which cannot be interleaved have the non-interleaved operation performed thereon. As a result, the performance of the memory is enhanced while eliminating the amount of user interface necessary.

24 Claims, 3 Drawing Sheets

SYSTEM AND METHOD FOR INTERLEAVING MEMORY BANKS

BACKGROUND

The present invention is directed to a device and method which automatically determine whether to interleave pairs of memory banks. More particularly, the present invention maps address bus bits to memory addresses in interleaved and non-interleaved modes which support desired row and column configurations of the memory as stored in a register file.

It is known to interleave memory banks to provide double wide memories so that the memory is used more efficiently. To interleave memory banks in known memory systems, certain types of single in line memory modules (SIMMs) must be placed in the corresponding sockets of a memory motherboard and DIP switches must be set to be indicative of the SIMMs placed in the sockets. Accordingly, these interleaved memory banks require a great deal of user interaction and knowledge. Also, either every memory bank pair in the known memory system must be interleaved or all of the memory banks must operate in a non-interleaved fashion in the known systems. In other words, previous systems do not allow a portion of the memory banks to be interleaved while the remaining portions operate in a non-interleaved fashion. In order to properly operate, each of the SIMMs used must additionally have the same type of row/column configuration, size and speed for interleaving.

One example of a system using interleaved memory is the Macintosh Quadra 800 (Apple Computer, Cupertino, Calif.). In this system, addressing and interleaving signals are all multiplexed together in a single stage. Because the Quadra 800 system has a relatively small number of memory banks (the Quadra 800 has 5 memory bank pairs), a significant delay in producing the end product to the memory does not result. However, as the number of bases in this system increases, the row addresses from the input bus and the interleaving signals are subjected to significantly more logic functions. Therefore, a large delay of the addressing and interleaving signals propagates through to the end product for the memory, and the generation of the interleaving and addressing signals takes more time and slows down the system.

It is therefore desired to provide a system and method for reducing the delays i producing the end product to the memory having a large number of memory banks where portions of the memory banks are interleaved. The present invention is also directed to reducing the amount of user interface necessary to configure a memory system and to increase the efficiency of the memory system by automatically interleaving the memory bank pairs which have the same row and column configurations.

SUMMARY

An object of the present invention is to provide a device and method for automatically interleaving the memory bank pairs which have the same row and column configurations so that the memory performance is improved by reducing the delays in producing the end product to the memory having a large number of memory bank pairs.

Another object of the present invention is to map address bus bits to memory address bits with two different modes which support desired row and column configurations as stored in a register file.

These objects of the present invention are fulfilled by providing a device for determining whether to interleave pairs of memory banks comprising a register file for storing bank bases and their associated address modes for a plurality of memory configurations, and an interleaving analyzing unit for comparing the configurations of the pairs of the memory banks to the bank bases stored in said register file corresponding to an input address and interleaving the pairs when the configurations are the same for each memory bank in the pairs. This device automatically interleaves each pair of the memory banks which have the same row and column configuration while the pairs of memory banks which do not have the same row and column configuration are not interleaved. As a result, the memory performance is improved by being operated in the most efficient manner with a minimal amount of user intervention.

These objects of the present invention are also fulfilled by providing a method for determining whether to interleave pairs of memory banks comprising the steps of storing bank bases and their associated address modes for a plurality of configurations in a register file, comparing the configurations of the pairs of the memory banks to said bank bases stored in said register file corresponding to an input address, and interleaving the pairs when the configurations are the same for each memory bank in the pairs. This method automatically interleaves the pairs of the memory banks which have the same row and column configurations so the memory performance is enhanced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent from those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, wherein.

DETAILED DESCRIPTION

Figure 1:
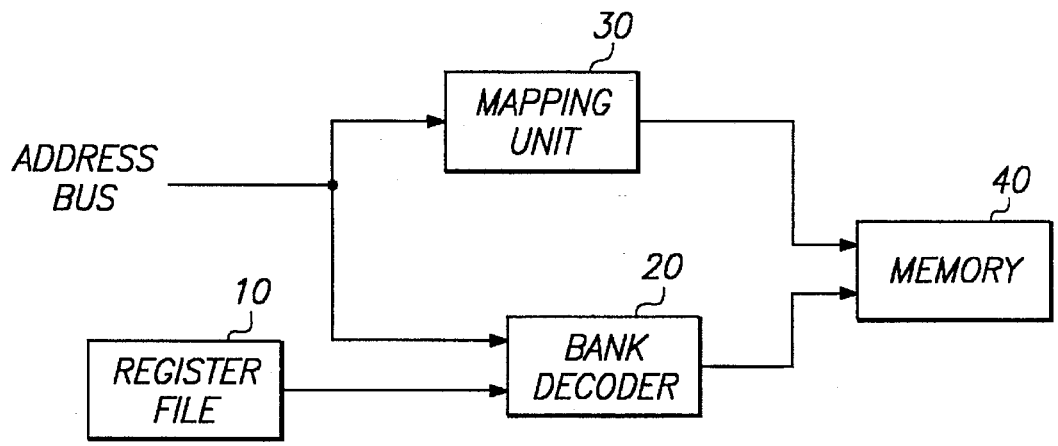
FIG. 1 illustrates a block diagram of the memory control device according to an embodiment of the present invention.

FIG. 1 shows a block diagram for a memory controller according to an embodiment of the present invention. In FIG. 1, a register file 10 for storing bases of the memory banks and their associated address modes, a bank decoder 20 for developing interleave enable, address mode and odd bank signals in response to an address bus input thereto, a mapping unit 30 for mapping the address bus bits based on the bank decoder 20 to a memory 40. This memory controller maps the bits from the address bus to addresses for the memory 40 in two different modes to support every desired memory configuration stored in the register file 10.

One example of the memory sizes that may be supported by the present memory controller using 4M technology DRAMs is illustrated below in Table 1.

TABLE 1

| Dram Density | SIMM Configuration | SIMM Capacity | Maximum Memory with 8 SIMMs | Maximum Memory with 12 SIMMs |
| --- | --- | --- | --- | --- |
| 4M Bit | 256K × 64 | 2M Bytes | 16M Bytes | 24M Bytes |
| 4M Bit | 512K × 64 | 4M Bytes | 32M Bytes | 48M Bytes |
| 4M Bit | 1M × 64 | 8M Bytes | 64M Bytes | 96M Bytes |
| 16M Bit | 1M × 64 | 8M Bytes | 64M Bytes | 96M Bytes |
| 16M Bit | 2M × 64 | 16M Bytes | 128 Bytes | 192M Bytes |
| 16M Bit | 4M × 64 | 32M Bytes | 256M Bytes | 384M Bytes |
| 64M Bit | 4M × 64 | 32M Bytes | 256M Bytes | 384M Bytes |
| 64M Bit | 8M × 64 | 64M Bytes | 512M Bytes | 768M Bytes |
| 64M Bit | 16M × 64 | 128M Bytes | 1G Bytes | 1.5G Bytes |

Table 1 is an illustrative example of the maximum memory sizes that may be supported for specific examples of the present invention and is not intended to be limitative for all of the maximum memory sizes that may be supported by this memory control.

Figure 2:
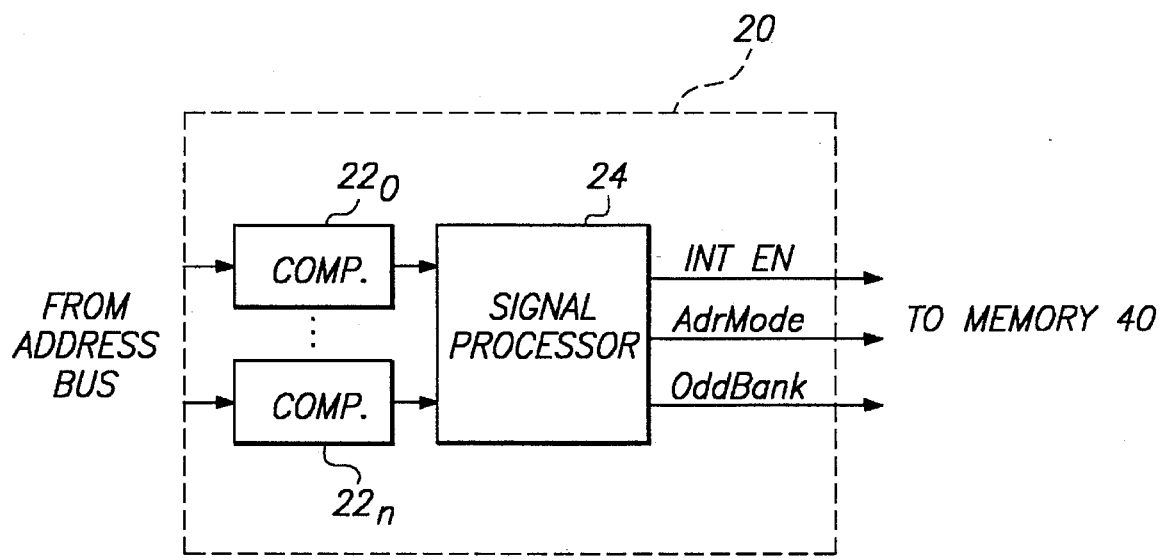
FIG. 2 illustrates a more detailed view of the banked code used in an embodiment of the present invention.

FIG. 2 provides a more detailed illustration of the bank decoder 20 used in an embodiment of the present invention. The bank decoder 20 includes a plurality of less than comparators $22_0$, $22_1$, ... $22_n$ which are input to a signal processor 24 for generating the interleave enable, address mode and odd bank signals. The less than comparators $22_0$, $22_1$, ... $22_n$ compare bits from the address bus to bits from the register file 10. For example, the register file 10 includes bank bases and associated address modes which are 8 bits wide with 2 entries per bank where the LSB correspond to the base addresses and 3 of the MSB correspond to interleave enable, address mode and odd bank states. Then, the signal processor receives the output from each of these comparators $22_0$, $22_1$, ... $22_n$ and performs a logical operation to generate the interleave enable, address mode and odd bank signals. The logical operation performed by the signal processor 24 is an AND/OR comparison of the bits from the register file 10 corresponding to the interleave enable, address mode or odd bank. More specifically, the logical operation for interleave enable is:

```
!ADRLT0●ADRLT1●INTEN0
‖!ADRLT1●ADRLT2●INTEN1
...
!ADRLT(n−1)●ADRLT(n)●INTEN(n−1)
‖!ADRLT(n)●INTEN(n)
``` where ADRLT represents a less than comparison of the address and INTEN represents the interleave enable bit of the register file 10. The logical operation for the address mode is performed similar to the interleave enable. The address mode signal is calculated according to the following relations:

```
!ADRLT0●ADRLT1●ADRMODE0
‖!ADDRLT1●ADRLT2●ADRMODE1
...
‖!ADRLT(n−1)●ADRLT(n)●ADRMODE(n−1)
‖!ADRLTn●ADRMODE(n)
``` where ADRMODE represents the address mode bit from the register file 10. The odd bank signal is generated according to the following operation:

```
!ADRLT1●ADRLT2
‖!ADRLT3●ADRLT4
...
‖!ADRLT(n)
```

Figure 3:
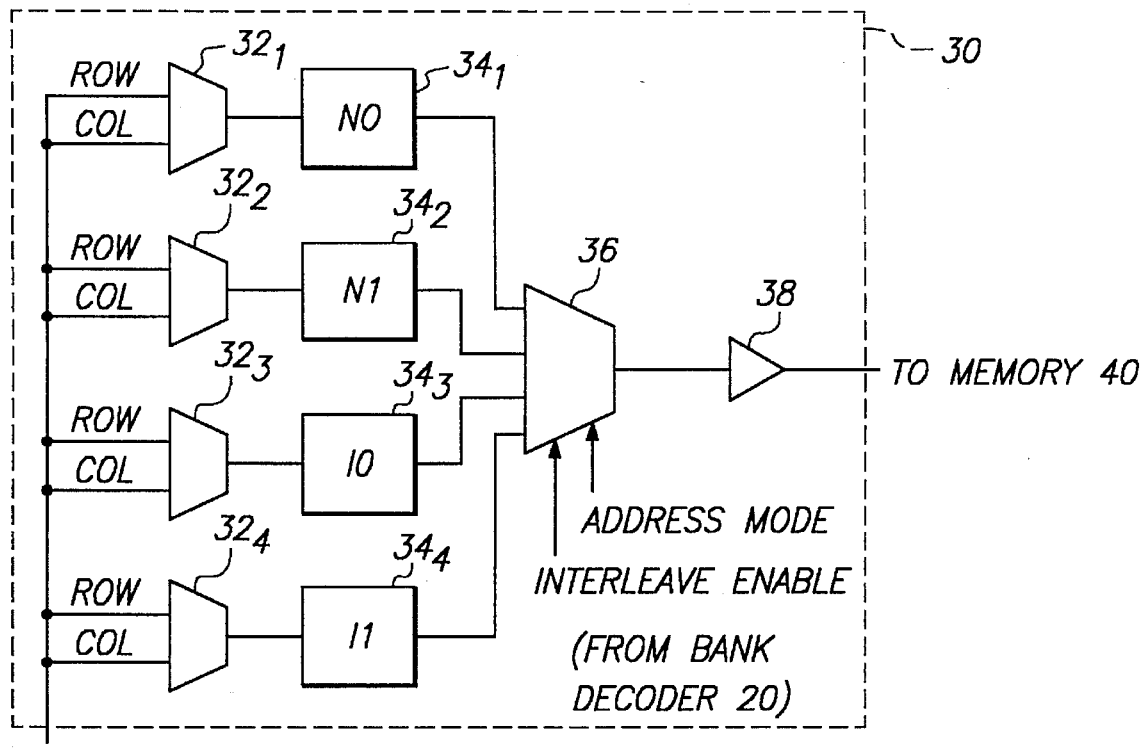
FIG. 3 illustrates a more detailed view of the mapping unit used in an embodiment of the present invention.

In FIG. 3, a more detailed illustration of the mapping unit 30 is provided. The mapping unit 30 includes four multiplexers for multiplexing the row and column addresses from the address bus. The output from the multiplexers $32_1$, $32_2$, $32_3$, and $32_4$ are respectively inputted to four registers $34_1$, $34_2$, $34_3$, and $34_4$. For instance, if the outputs of the multiplexers $32_1$, $32_2$, $32_3$ and $32_4$ are 12 bits wide, 12 bit registers are used and output four 12 bit signals. The four registers correspond to non-interleaved and interleaved modes for adjacent banks and are used in the remapping process. In particular, the two registers $34_1$ and $34_2$ correspond to the non-interleaved mode and the two registers $34_3$ and $34_4$ correspond to the interleaved mode. The outputs from the registers $34_1$, $34_2$, $34_3$, and $34_4$ are remapped by the multiplexer 36 in response to the interleave enable and address mode signals generated by the bank decoder 20. The output of the multiplexer 36 is then input to an amplifier 38 in order to generate the memory address.

Figure 4:
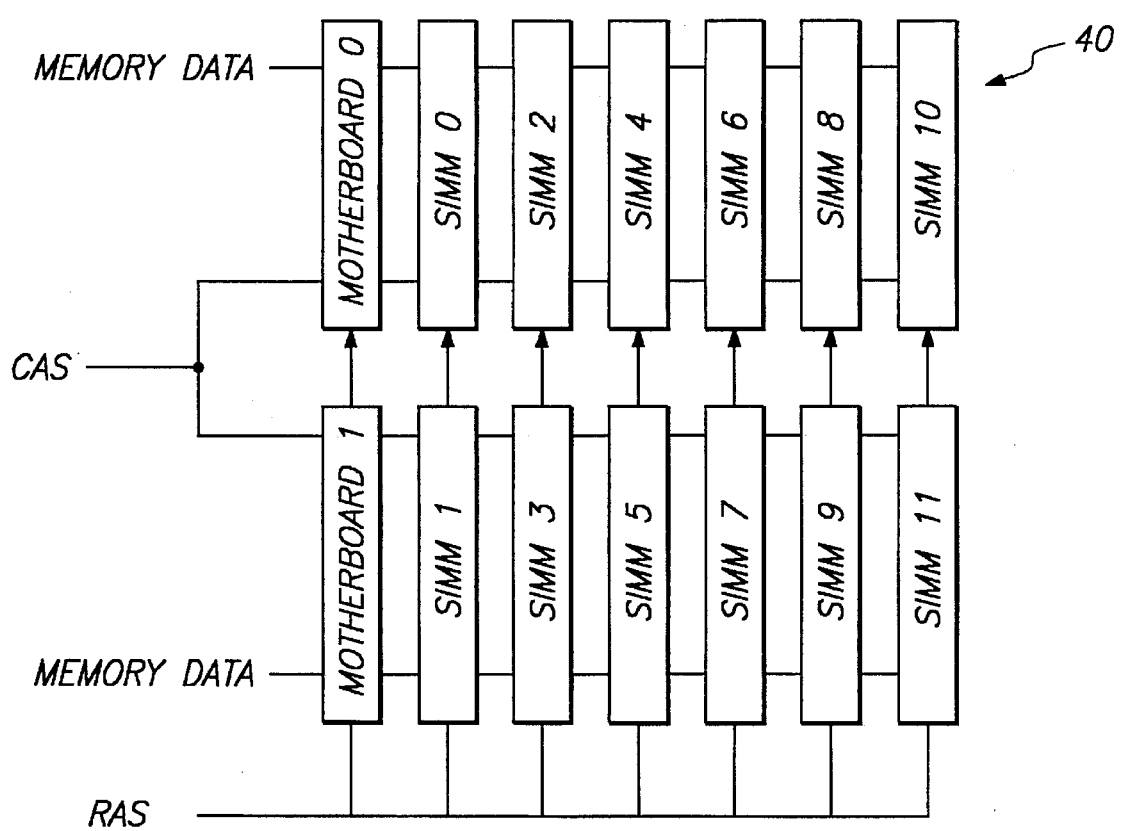
FIG. 4 illustrates an example of a memory module configuration for an embodiment of the present invention.

In an illustrative example for the present invention, the memory controller may support a 128 bit wide, 2 bank interleaved operation or a 64 bit wide, single bank operation selectable on a per bank basis. FIG. 4 illustrates an example of a memory configuration 40 for an embodiment of the present invention. In this example, motherboard banks 0 and 1 are soldered on the motherboard as a single interleaved set which yields 8M Bytes with 16 512K×8 DRAMs. Alternatively, 32 1M×4 parts could be soldered to the motherboard as a single interleaved set to yield 16M Bytes of on-board memory. In addition to the on-board memory, sockets corresponding to SIMM 0 through SIMM 11 are provided. When both memory banks in a pair are present, the pair of memory banks are cycled at the same time, with data from one memory bank transferred onto the address bus before the data from the other memory bank. For a 32 byte burst transaction, the DRAMs are cycled two times and when a single memory bank in a pair is present, the bank is cycled four times. To properly configure the memory system in this example, each bank of SIMMs is assigned a base address with a pair of registers that are concatenated together to form an 11 bit register for defining the base address, the addressing mode and whether the bank is interleaved with its companion bank. For the example illustrated in FIG. 4, 26 pairs of these registers are implemented to control two banks of on-board memory and 24 banks of expansion SIMMs (12 double-sided SIMM sockets).

When the interleave enable bit is set, a given set of memory banks will operate an interleaved set of memory banks for providing double-wide memory. This interleave enable bit is only implemented for the even banks and the bit for the odd bank is always set. The address mode bit in the register file 10 configures the mapping of the address bus bits to memory RAS/CAS address bits for enabling support of all configurations of 1, 4, 16, and 64M DRAMs corresponding to one set of memory configurations. Table 2 below summarizes address mode bit settings for 1M, 4M, 16M and 64 DRAMs.

TABLE 2

| DRAM Type | Row Bits | Column Bits | Mode Bit Setting |
| --- | --- | --- | --- |
| 1M Bit 1M x 1 | 10 | 10 | 1 |
| 1M Bit 256K x 4 | 9 | 9 | 1 |
| 4M Bit 4M x 1 | 11 | 11 | 1 |
| 4M Bit 1M x 4 | 10 | 10 | 1 |
| 4M Bit 512K x 8 | 10 | 9 | 1 |
| 4M Bit 256K x 16 | 10 | 8 | 0 |
| 16M Bit 16M x 1 | 12 | 12 | 0 |
| 16M Bit 4M x 4 | 11 | 11 | 1 |
| 16M Bit 4M x 4 | 12 | 10 | 1 |
| 16M Bit 2M x 8 | 11 | 10 | 1 |
| 16M Bit 2M x 8 | 12 | 9 | 0 |
| 16M Bit 1M x 16 | 12 | 8 | 0 |
| 64M Bit 16M x 4 | 12 | 12 | 0 |
| 64M Bit 8M x 8 | 12 | 11 | 0 |
| 64M Bit 4M x 16 | 11 | 11 | 1 |
| 64M Bit 4M x 16 | 12 | 10 | 1 |

The base address field in the register file 10 is used as the base address that the address bus addresses are compared to. If these address bits are greater than or equal to this field and less than the value of bank n+1 base, the given base is selected.

The address bus to memory address mapping for non-interleaved banks is illustrated below in Table 3 for non-interleaved banks.

TABLE 3

| AddressMode | DR0 | DR1 | DR2 | DR3 | DR4 | DR5 | DR6 | DR7 | DR8 | DR9 | DR10 | DR11 |
| --- | --- | --- | --- | --- | --- | --- | --- | --- | --- | --- | --- | --- |
| AddrMode=0 RAS Address | AR9 | AR10 | AR11 | AR12 | AR13 | AR14 | AR15 | AR16 | AR17 | AR18 | AR19 | AR20 |
| AddrMode=0 CAS Address | AR5 | AR6 | AR7 | AR8 | AR21 | AR22 | AR23 | AR24 | AR25 | AR26 | AR27 | AR28 |
| AddrMode=1 RAS Address | AR7 | AR8 | AR10 | AR11 | AR12 | AR13 | AR14 | AR15 | AR16 | AR17 | AR18 | AR19 |
| AddrMode=1 CAS Address | AR6 | AR7 | AR9 | AR20 | AR21 | AR22 | AR23 | AR24 | AR25 | AR26 | AR27 | AR28 |

The mapping of the address bus to memory address for interleaved banks is illustrated below in Table 4.

| AddressMode | DR0 | DR1 | DR2 | DR3 | DR4 | DR5 | DR6 | DR7 | DR8 | DR9 | DR10 | DR11 |
| --- | --- | --- | --- | --- | --- | --- | --- | --- | --- | --- | --- | --- |
| AddrMode=0 RAS Address | AR8 | AR9 | AR10 | AR11 | AR12 | AR13 | AR14 | AR15 | AR16 | AR17 | AR18 | AR19 |
| AddrMode=0 CAS Address | AR4 | AR5 | AR6 | AR7 | AR20 | AR21 | AR22 | AR23 | AR24 | AR25 | AR26 | AR27 |
| AddrMode=1 RAS Address | AR6 | AR7 | AR9 | AR10 | AR11 | AR12 | AR13 | AR14 | AR15 | AR16 | AR17 | AR18 |
| AddrMode=1 CAS Address | AR5 | AR6 | AR8 | AR9 | AR20 | AR21 | AR22 | AR23 | AR24 | AR25 | AR26 | AR27 |

Figure 5:
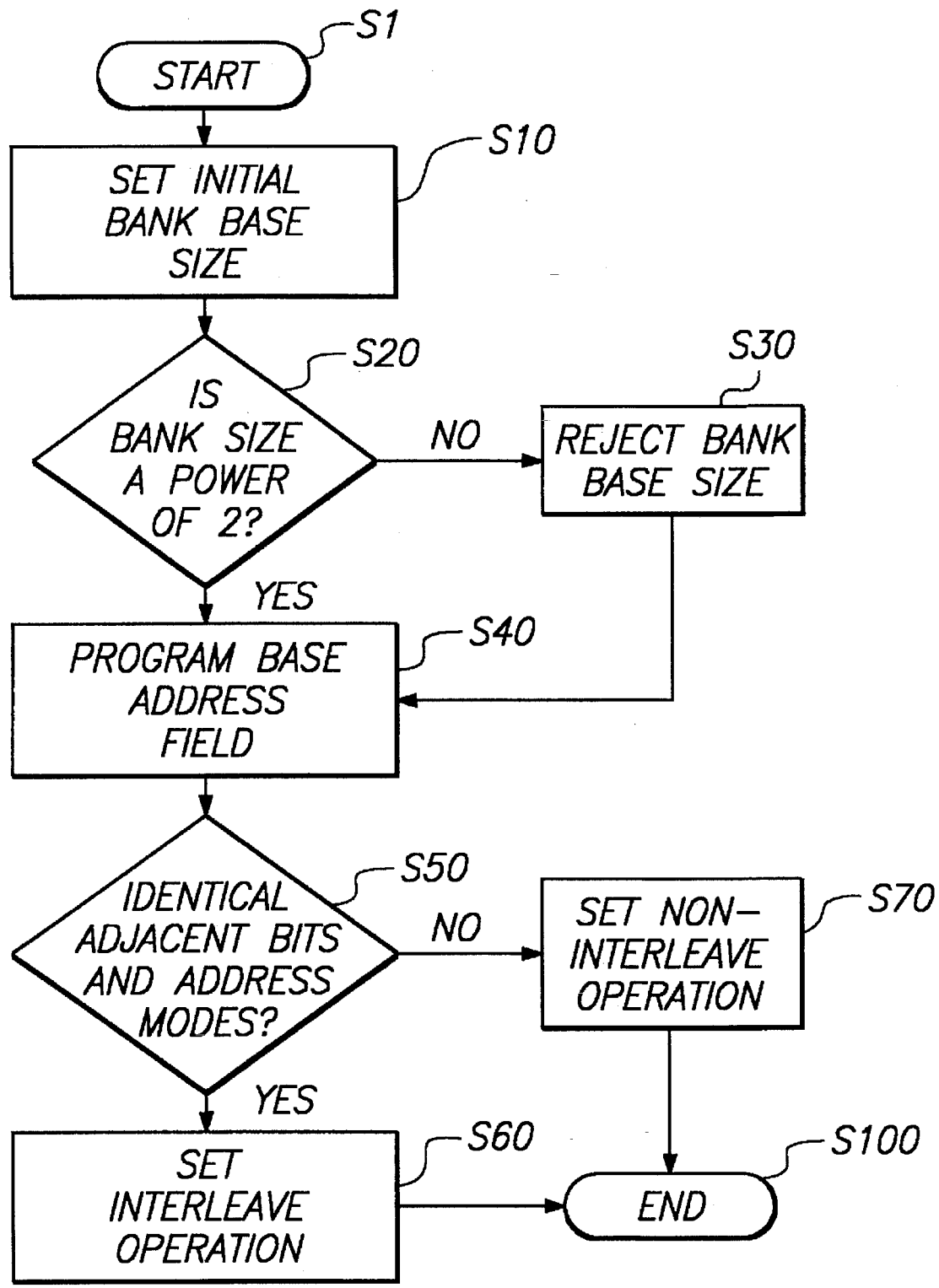
FIG. 5 illustrates a flow chart for an embodiment of the present invention.

To properly configure the memory controller, the following memory sizing operation is performed upon starting up as illustrated by the flow chart in FIG. 5. To determine whether the size of adjacent memory banks may be interleaved, the size of the adjacent memory banks are analyzed to determine whether they are the same. At step S10 of FIG. 5, each bank base is set to be 16'B0000 000n nnnn 0000, for example, where n is the binary bank number. Also at step S10, the bank is sized by clearing the address mode bit. Next, it is determined at step S20 whether the bank size is the power of 2. If the bank size is determined not to be a power of 2 at step S20 (the size of 5 MB or 13 MB, for instance), step S30 is executed. At step S30, each bank base is set to be 16'B0000 001n nnnn 0000 in this example. The bank is also sized at step S30 with the address mode bit being set. If the bank size is determined to be a power of 2 at step S20, or after completing step S30, step S40 is executed where the base address field is programmed for each bank with the first nine bits of the first address in the bank. The first address of a given bank is a function of the sum of the sizes of all lower numbered banks. Then, it is determined at step S50 whether a given set of adjacent banks are the same size and have identical addressing modes. If it is determined at step S50 that the adjacent banks are the same size and their address modes are identical, the interleave bit is set in the even memory bank base register for performing an interleave operation at step S60. If the given set of adjacent banks are not the same size or their addressing modes are not identical, the interleave bit is set to 0 and the non-interleave operation is performed.

The embodiments of the present invention allow address bus bits to be mapped to memory address bits in two different modes for supporting each desired memory configuration. Furthermore, the performance of the memory is improved by automatically determining the pairs of memory banks having the same size the row/column configuration. As a result, the memory operates with a combination of interleaved and non-interleaved memory bank pairs. Also, the present invention eliminates the user interaction necessary to determine whether interleaving is possible and the corresponding set-up operations for interleaving.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for mapping a bus address to a memory address comprising:

a bank decoder for developing interleave enable, address mode and odd bank signals responsive to the bus address and a register file, said register file storing a bank base and corresponding address modes for a selected one of a plurality of desired memory configurations;

mode selecting means for selecting between first and second modes of said bank base and the corresponding address modes to generate the memory address which supports said selected one of said desired memory configurations; and a mapping unit for mapping the bus address to the memory address by selecting between said first and second modes based on said interleave enable and address mode signals, said mapping unit including, a plurality of first multiplexers for performing a direct hard wire mapping of row and column addresses from the bus address, a plurality of registers for registering said row and column addresses from said first multiplexers, and a second multiplexer for selecting said row and column addresses from said registers corresponding to one of said first and second modes selected.

2. A device according to claim 1, wherein said bank decoder includes, a plurality of comparators for comparing the bus address with the corresponding address modes, and a signal processor for processing the outputs from said comparators to develop said interleave enable, address mode and odd bank signals.

3. A device according to claim 1, wherein said plurality of first multiplexers and said plurality of registers comprise two multiplexers and two registers for non-interleaved first and second memory bank addresses and two multiplexers and two registers for interleaved first and second memory bank addresses.

4. A device according to claim 3, wherein said first mode selects said non-interleaved first and second memory bank addresses and said second mode selects said interleaved first and second memory bank addresses.

5. A device for processing pairs of memory banks by interleaved and non-interleaved operations comprising:

comparing means for comparing the size and row/column configuration of the memory banks in each of the pairs; and interleaving means for performing non-interleaved operations on each of the pairs which fail to have identical size and row/column configurations and performing interleaved operations on each of the pairs which have identical size and row/column configurations, said interleaving means includes, a plurality of first multiplexers for performing a direct hard wire mapping of row and column addresses from a bus address, a plurality of registers for registering said row and column addresses from said first multiplexers, and a second multiplexer for selecting said row and column addresses from said registers corresponding to interleaved and non-interleaved operations.

6. A device according to claim 5, wherein said comparing means includes, a register file for storing a bank base and corresponding address modes for a selected one of a plurality of desired memory configurations, and a bank decoder for decoding a bus address to interleave enable, address mode and odd bank signals.

7. A device according to claim 6, wherein said bank decoder includes, a plurality of comparators for comparing said bus address to said address modes, and a signal processor for processing the outputs from said comparators to develop said interleave enable, address mode and odd bank signals.

8. A device according to claim 5, wherein said plurality of first multiplexers and registers comprise two multiplexers and two registers for non-interleaved pairs of memory banks and two multiplexers and two registers for interleaved pairs of memory banks.

9. A device for determining whether to interleave pairs of memory banks comprising:

comparing means for comparing the size and row/column configuration in the pair of memory banks; and interleaving means for performing a non-interleaved operation on the pair of memory banks which fail to have an identical size and row/column configuration and performing an interleaved operation on the pair of memory banks which have an identical size and row/column configuration, said interleaving means includes, a plurality of first multiplexers for performing a direct hard wire mapping of row and column addresses from a bus address, a plurality of registers for registering said row and column addresses from said first multiplexers, and a second multiplexer for selecting said row and column addresses from said register corresponding to said interleaved and non-interleaved operations.

10. A device according to claim 9, wherein said comparing means includes, a register file for storing a bank base and corresponding address modes for a selected one of a plurality of desired memory configurations, and a bank decoder for decoding a bus address to interleave enable, address mode and odd bank signals.

11. A device according to claim 10, wherein said bank decoder includes, a plurality of comparators for comparing said bus address to said address modes, and a signal processor for processing the outputs from said comparators to develop said interleave enable, address mode and odd bank signals.

12. A device according to claim 9, wherein said plurality of first multiplexers and registers comprise two multiplexers and two registers for performing said interleaved operation on the pair of memory banks and two multiplexers and two registers for performing said non-interleaved operation on the pair of memory banks.

13. A method for mapping a bus address to a memory address comprising the steps of:

(a) developing interleave enable, address mode and odd bank signals responsive to the bus address and a register file; and (b) storing a bank base and corresponding address modes for a selected one of a plurality of desired memory configurations in said register file;

(c) selecting between first and second modes of said bank base and the corresponding address modes to generate the memory address which supports said selected one of said desired memory configurations; and (d) mapping the bus address to the memory address by selecting between said first and second modes based on said interleave enable and address mode signals, said step (b) includes the steps of, (d)(1) performing a direct hard wire mapping of row and column address from the bus address by a plurality of first multiplexers, (d)(2) registering said row and column addresses from said first multiplexers by a plurality of registers, and (d)(3) selecting said row and column addresses from said registers corresponding to one of said first and second modes selected.

14. A method according to claim 13, wherein said step (a) includes the steps of, (a)(1) comparing the bus address with the corresponding address modes by a plurality of comparators, and (a)(2) processing the outputs from said comparators to develop said interleave enable, address mode and odd bank signals.

15. A method according to claim 13, wherein said plurality of first multiplexers and said plurality of registers comprise two multiplexers and two registers for non-interleaved first and second memory bank addresses and two multiplexers and two registers for interleaved first and second memory bank addresses.

16. A method according to claim 15, wherein said first mode selects said non-interleaved first and second memory bank addresses and said second mode selects said interleaved first and second memory bank addresses.

17. A method for processing pairs of memory banks by interleaved and non-interleaved operations comprising the steps of:

(a) comparing the size and row/column configuration of the memory banks in each of the pairs; and (b) performing non-interleaved operations on each of the pairs which fail to have identical size and row/column configurations and performing interleaved operations on each of the pairs which have identical size and row/column configurations, said step (b) includes the steps of, (b)(1) performing a direct hard wire mapping of row and column addresses from a bus address by a plurality of first multiplexers, (b)(2) registering said row and column addresses from said first multiplexers by a plurality of registers, and (b)(3) selecting said row and column addresses from said registers corresponding to interleaved and non-interleaved operations.

18. A method according to claim 17, wherein said step (a) includes the steps of, (a)(1) storing a bank base and corresponding address modes for a selected one of plurality of desired memory configurations, and (a)(2) decoding a bus address to interleave enable, address mode and odd bank signals.

19. A method according to claim 18, wherein said step (a)(2) includes the steps of, comparing said bus address to said address modes by a plurality of comparators, and processing the outputs from said comparators to develop said interleave enable, address mode and odd bank signals.

20. A method according to claim 17, wherein said plurality of first multiplexers and registers comprise two multiplexers and two registers for non-interleaved pairs of memory banks and two multiplexers and two registers for interleaved pairs of memory banks.

21. A method for determining whether to interleave pairs of memory banks comprising the steps of:

(a) comparing the size and row/column configuration in the pair of memory banks; and (b) performing a non-interleaved operation on the pair of memory banks which fail to have an identical size and row/column configuration and performing an interleaved operation on the pair of memory banks which have an identical size and row/column configuration, said step (b) includes the steps of, (b)(1) performing a direct hard wire mapping of row and column addresses from a bus address by a plurality of first multiplexers, (b)(2) registering said row and column addresses from said first multiplexers by a plurality of registers, and (b)(3) selecting said row and column addresses from said register corresponding to said interleaved and non-interleaved operations.

22. A method according to claim 21, wherein said step (a) includes the steps of, (a)(1) storing a bank base and corresponding address modes for a selected one of a plurality of desired memory configurations, and (a)(2) decoding a bus address to interleave enable, address mode and odd bank signals.

23. A method according to claim 22, wherein said step (a)(2) includes the steps of, comparing said bus address to said address modes by a plurality of comparators, and processing the outputs from said comparators to develop said interleave enable, address mode and odd bank signals.

24. A method according to claim 21, wherein said plurality of first multiplexers and registers comprise two multiplexers and two registers for performing said interleaved operation on the pair of memory banks and two multiplexers and two registers for performing said non-interleaved operation on the pair of memory banks.

* * * * *